United States Patent [19]

Sota

[11] Patent Number: 4,608,467
[45] Date of Patent: Aug. 26, 1986

[54] SWITCH DEVICE

[75] Inventor: Yasuo Sota, Tsurugashima, Japan

[73] Assignee: Elmec Corporation, Tsurugashima, Japan

[21] Appl. No.: 680,542

[22] Filed: Dec. 11, 1984

[30] Foreign Application Priority Data

Dec. 14, 1983 [JP] Japan .................. 58-192743[U]

[51] Int. Cl.⁴ .................. H01H 1/00; H01H 15/06
[52] U.S. Cl. .................................................. 200/16 D
[58] Field of Search ............ 200/16 C, 16 D, 16 E, 200/16 B, 252, 257, 283, 291, 292, 275

[56]  References Cited
U.S. PATENT DOCUMENTS 3,493,706  2/1970  Cherry et al. ............. 200/16 D
3,632,909  1/1972  Rowley ..................... 200/16 D
3,857,000 12/1974  Boulanger ................. 200/16 D Primary Examiner—J. R. Scott
Attorney, Agent, or Firm—Wegner & Bretschneider

[57] ABSTRACT

A switch device suitable for switching superhigh-speed signals is disclosed which comprises a row of fixed contacts formed by having a plurality of fixed contacts arranged as regularly spaced, a conductive plate disposed above and along the row of fixed contacts, a movable contact formed as bent substantially in the shape of the letter W incorporating therein a first curve located at the center and held in contact with the row of fixed contacts and second curves located at the outer sides and held in contact with the conductive plate, and a holder disposed between the conductive plate and the row of fixed contacts and adapted to accommodate therein the movable contact, whereby the holder is enabled to push one of the end parts of the movable contact and the movable contact is consequently enabled to move in conjunction with the holder. The movable contact is further provided at the opposite end parts thereof with third curves adapted to come into contact with the holder.

3 Claims, 7 Drawing Figures

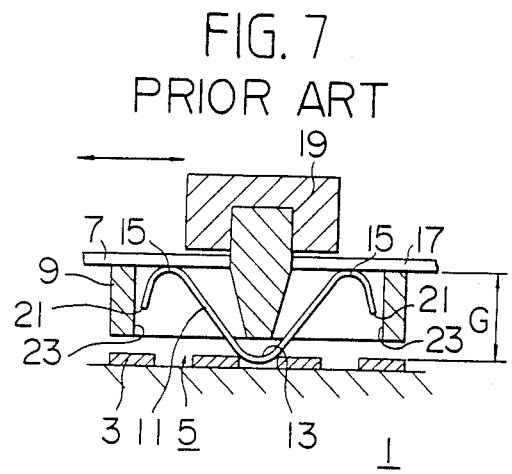
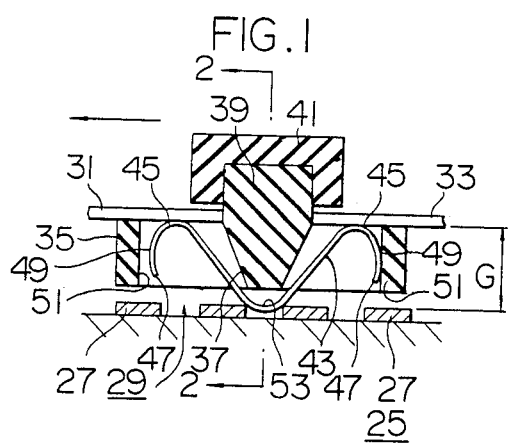
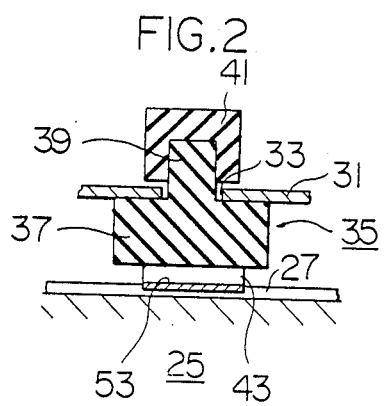
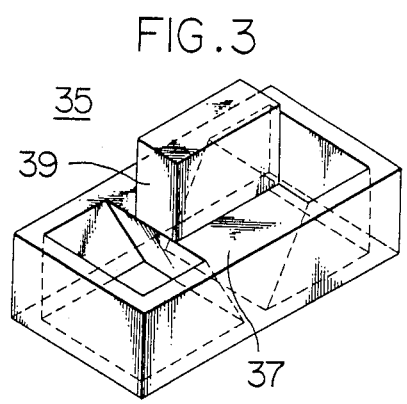

SWITCH DEVICE

BACKGROUND OF THE INVENTION

1. Field of the Invention

This invention relates to a switch device for selectively switching a plurality of fixed contacts, and more particularly to a switch device suitable for an electronic device which operates during switching superhigh-speed signals such as, for example, a variable mechanism for a superhigh-speed variable delay line.

2. Description of the Prior Art

A conventional switch device of this kind is constructed as illustrated in the diagram titled "Prior Art".

To be specific, this switch device is constructed by forming a row 5 of a plurality of fixed contacts 3 spaced at a prescribed pitch on a board 1, disposing a conductive plate 7 above the row 5 of fixed contacts, interposing a holder 9 in the shape of a frame between the conductive plate 7 and the row 5 of fixed contacts, and setting a contact spring 11 substantially in the shape of the letter W within the holder 9 in such a manner that a central curved part 13 there of will come into resilient contact with the fixed contacts 3 and outer curved parts 15,15 at the opposite ends thereof will come into contact with the conductive plate 7. The holder 9 has its part thrust out of a slit 17 formed in the conductive plate 7 in the direction of the row 5 of fixed contacts and has a knob 19 attached to the thrust part, so that the holder 9 is supported by keeping the conductive plate 7 nipped between itself and the knob 19. In the contact spring 11, the end ports from the outer curved parts 15,15 to opposite free ends 21,21 are short and these free ends 21,21 are adapted to come into contact with inner walls 23,23 of the holder 9.

In the switch device so constructed, when the holder 9 is moved by a push given to the knob 19, one of the inner walls 23,23 of the holder 9 pushes one of the free ends 21,21 of the contact spring 11 and, consequently, the contact spring 11 is moved in conjunction with the holder 9. Any fixed contact 3 selected from the row 5 of fixed contacts, therefore, can be connected to the conductive plate 7 with the contact spring 11 serving as a movable contact.

When a superhigh-frequency signal having a rise time of not more than 1 ns is applied to the conductive plate 7, this signal flows to the fixed contact 3 through the two paths between the curved parts 15-13 and between the curved parts 15-13 of the contact spring 11. Since this contact spring 11 has a low inductance in the sections thereof used for the flow of the signal, this switch device is believed to suit the switching of superhigh-speed signals.

During the course of quantity production of switch devices of the aforementioned construction, however, a gap G between the row 5 of fixed contacts and the conductive plate 7 is liable to disperse from one product to another, and the shape of curved of the contact spring 11 tends to vary from one switch device to another. When the gap G is dispersed, the position and the angle which the free and 21 of the contact spring 11 assumes and forms on contact with the inner wall 23 of the holder 9 vary and the sensation from the manipulation of the knob 19 varies from one switch device to another. Thus, the reliability of the switch device of this conventional construction is jeopardized by such possibility of quality dispersion and is degraded high yield in quantity production.

When the contact spring 11 moves on while alternately repeating single contact with one fixed contact 3 and dual contact with two adjacent fixed contacts 3 in consequence of the motion of the knob 19, the curved shape of the contact spring 11 similarly repeats variation for each change from single contact to dual contact. Thus, the position and the angle which the free end 21 of the contact spring 11 assumes and forms on contact with the inner wall 23 vary for each change from single contact to dual contact, with the result that the slidability of the free end 21 is degraded, and the inferior sensation of the manipulation of the knob 19 is exacerbated all the more. Moreover, since the pressure of contact which the contact spring 11 exerts upon the fixed contacts 3 is alternately increased and decreased both greatly, the surfaces of the fixed contacts 3 and the contact spring 11 are worn out quickly so much as to impair the stability of contact resistance and degrade the reliability of performance.

For the solution of these drawbacks, it is sufficient to improve the accuracy of component and the accuracy of work of assembly and minimize the dispersion in the gap G between the row 5 of fixed contacts and the conductive plate 7. The efforts directed to the fulfilment of the requirement, however, prove impracticable because they entail a rise of the production cost and a fall of the efficiency of production.

SUMMARY OF THE INVENTION

This invention has been materialized for the purpose of solving the drawbacks of the conventional switch device mentioned above.

A primary object of this invention is to provide a switch device which gives consistent sensation of manipulation during switch of fixed contacts and warrants high yield in quantity production.

Another object of this invention is to provide a switch device which curbs abrupt wear in the regions of contact between the fixed contacts and the movable contact and enjoys stable contact resistance and high reliability of performance.

To attain these objects, the present invention provides a switch device which comprises a row of fixed contacts formed by having a pluarlity of fixed contacts spaced regularly, a conductive plate supported above the row of fixed contacts parallelly therto, a movable contact formed as curved substantially in the shape of the letter W with a first curve at the center thereof resiliently held in contact with the row of fixed contacts and second curves at the opposite outer sides thereof similarly in contact with the conductive plate, and a holder disposed between the conductive plate and the row of fixed contacts and adapted to accomodate the movable contact. This switch device is characterized in that the movable contact is further provided in the opposite end parts between the second curved and the free ends with third curves adapted to come into contact with the inner walls of the holder.

Owing to the construction of this invention described above, the slide of the movable contact relative to the inner walls of the holder remains to be highly smooth in spite of the variation in the curved shape of the movable contact. If the quantity production of switch devices of this construction is suffered to entail dispersion in the gap G between the conductive plate and the row of fixed contacts, no rigid attention is required to be paid to excessively heightening the accuracy of components or the accuracy of work of their assembly. The switch device enjoys stable sensation of manipulation during switching and high reliability of performance.

The other objects and the effects of the present invention will become apparent to those skilled in the art as the disclosure is made in the following description of a preferred embodiment of the invention, as illustrated in the accompanying drawings.

BRIEF DESCRIPTION OF THE DRAWINGS

FIG. 1 is a longitudinal cross section illustrating a typical switch device as one embodiment of the present invention.

FIG. 2 is a lateral cross section of the switch device of FIG. 1 as taken along the line 2—2.

FIG. 3 is a perspective view of a holder in the switch device of FIG. 1.

FIG. 7 is a longitudinal cross-section illustrating a prior art switch construction on which this invention forms an improvement.

DETAILED DESCRIPTION OF THE PREFERRED EMBODIMENT

Figure 4:
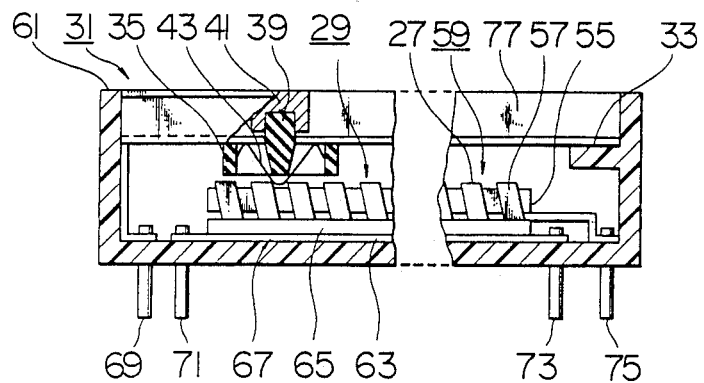
FIG. 4 is a (partially sectioned) front view of a variable delay line incorporating therein the switch device of this invention.

Now, the present invention will be described below with reference to a preferred embodiment. As shown in FIG. 1 and FIG. 2, on an insulating board 25, a plurality of fixed contacts 27 are disposed as spaced by a prescribed pitch to form a row 29 of fixed contacts. Above the row 29 of fixed contacts, a conductive plate 31 supported in position with a supporting member not shown in the diagrams is disposed at a distance along the row 29 of fixed contacts. In the conductive plate 31, a slit 33 is formed along the row 29 of fixed contacts.

Between the row 29 of fixed contacts and the conductive plate 31, a holder 35 formed of an insulating synthetic resin material in the shape of a frame as illustrated in FIG. 3 is interposed. Within this holder 35, crosspiece 37 concurrently serving as a reinforcement is integrally formed in a manner to partition the interior of the holder 35. A projection 39 formed on the upper central part of the crosspiece 37 is thrust out the slit 33 in the conductive plate 31, with a knob 41 attached to the projection 39 as illustrated in FIG. 1. The holder 35, therefore, is supported from the conductive plate 31 by keeping the conductive plate 31 interposed between the upper side thereof and the lower side of the knob 41.

Inside the holder 35, a contact spring 43 functioning as a movable contact (illustrated in FIG. 1 as observed from the front side) is accommodated. This contact spring 43 is formed by bending substantially in the shape of the letter W in cross section a thin narrow strip of a relatively tough conductive material such as beryllium. The contact spring 43, therefore, possesses a first curve 53 situated at the center and second curves 45,45 situated one each at the outer sides of the first curve 53. The contact spring 43 is further provided in the opposite end ports extending from the second curves 45,45 to the opposite free ends 47,47 with third curves 49,49 bent inwardly and continued into the second curves 45,45. The contact spring 43 is accommodated within the holder 35 in such a manner that the first curve 53 is held resiliently in contact with the fixed contacts 27 below the crosspiece 37, the second curves 45,45 resiliently held in contact with the conductive plate 31, and the third curves 49,49 held in contact with an inner walls 51,51 of the holder 35. In other words, the contact spring 43 is contained in the holder 35 in such a manner that the curved strip thereof is brought into intimate contact at one of the two curves 45,45 thereof with the conductive plate 31 transversely relative to the slit 33, then extended under the crosspiece 37, brought into intimate contact at the first curve 53 with the fixed contact 27, and futher extended similarly and brought into intimate contact at the other second curves 45,45 with the conductive plate 31 transversely relative to the slit 33.

In the switch device constructed as described above, when the knob 41 is moved, the holder 35 pushes the third curve 49 of the contact spring 43 and, as the result, the contact spring 43 moves in conjunction with the holder 35 and effects selective connection between a desired fixed contact 27 and the conductive plate 31. in this case, the slide of the contact spring 43 on the inner wall 51 of the holder 35 is smooth because the third curve 49 of the contact spring 43 comes into contact with the inner wall 51. Even when a gap G between the row 29 of fixed contacts and the conductive plate 31 is dispersed and the curved shape of the contact spring 43 is consequently variable from one switch device to another from the assembly line, the slide of the contact spring 43 is uniform enough to ensure production of stable sensation of manipulation. Thus, the switch device of this construction enjoys high yield in quantity production.

Even when the contact spring 43 is so constructed that, while in motion along the row 29 of fixed contacts. it alternately repeats single contact with one fixed contact 27 and dual contact with two adjacent fixed contacts 27, the pressure of contact of the contact spring 43 with the individual fixed contacts 27 is uniform enough for the switch device to enjoy high reliability of performance.

The contact spring 43 is not required to be accurately in the curved shape of the letter W. It serves its function sufficiently so long as it is formed in an undulated shape containing the aforementioned first through third curves 53,45, and 49. The third curves 49,49 are not always required to be formed continuously from the second curves 45,45 but may be formed independently in the opposite end parts of the contact spring 43.

In the preferred embodiment cited above, the switch device of the present invention has been described as an independent entity. Since this invention is intended for utility in ordinary electronic devices such as, for example, a variable delay line. Now, therefore, a typical utility of the switch device of this invention will be described below. In the drawings which follow, the components appearing in FIG. 1 are denoted by like symbols.

Figure 5:
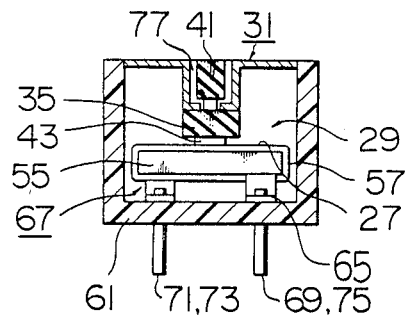
FIG. 5 is a (partially sectioned) side view of the variable delay line of FIG. 4.

FIG. 4 and FIG. 5 are a partially sectioned front view and a partially sectioned side view of the switch device of the present invention as applied to a variable delay line.

As shown in the diagrams, an inductance element 59 is formed by winding a conductor strip 57 in a single-layer solenoid as spaced around a bobbin 55 of the shape of a slender plate.

On the inner bottom surface of a case 61 of synthetic resin in the shape of a box having an open top, a dielectric plate 65 is disposed through the medium of a common electrode 63, and the inductance element 59 is superposed on the dielectric plate 65 with the wider surfaces lying in the upper and lower sides thereof. Capacitors 67 are composed of the dielectric plate 65, the common electrode 63 underlying the dielectric plate 65, and the portions of the conductor strip 57 on the lower side of the inductance element 59. Consequently, there is formed a lumped-constant type electromagnetic delay line which has a plurality of sections with capacitors 67 connected between the conductor strip 57 and the common electrode 63 one each for the turns of the inductance element 59.

The portions of the conductor strip 57 on the upper side of the inductance element 59 partly constitute themselves fixed contacts 27. These fixed contacts 27 of the successive turns make up a row 29 of fixed contacts. Thus, the bobbin 55 functions as the board 25 and the portions of the conductor strip 57 on the upper side function as the fixed contacts 27.

In the bottom part of the case 61, an input terminal 69, input and output common terminals 71, 73 connected to the common electrode 63, and an output terminal 75 are planted. One end of the conductor strip 57 wound around the bobbin is connected to the output terminal 75 and the other end thereof is connected to the common electrode 63 via a resistance Ro (not shown in FIG. 4 or FIG. 5).

Figure 6:
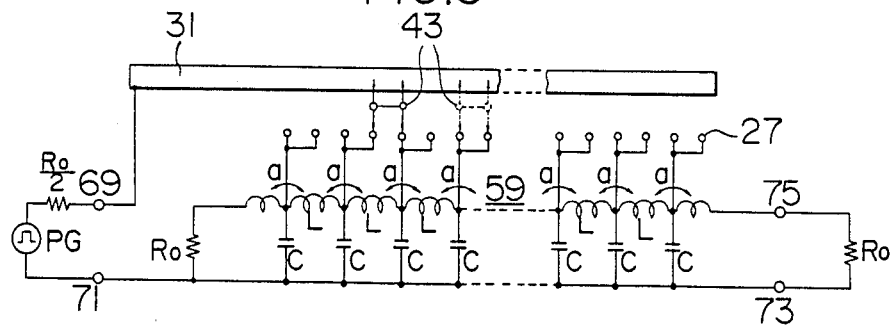
FIG. 6 is an equivalent circuit diagram of the variable delay line of FIG. 4.

In the open part of the case 61 is fitted the conductive plate 31 adapted to close the case 61. One end of the conductive plate 31 is extended along one inner surface of the case 61 and connected to the input terminal 69. In the conductive plate 31, a depressed part 77 is formed along the row 29 of fixed contacts. Below the depressed part 77, the holder 35 is disposed between the conductive plate 31 and the inductance element 59. Inside the holder 35, the contact spring 43 formed as bent substantially in the shape of the letter W as illustrated in FIG. 1 is accommodated so as to remain resiliently in contact with the row 29 of fixed contacts and the conductive plate 31. The projection 39 from the holder 35 is thrust out of the slit 33 formed in the bottom of the depressed part 77 of the conductive plate 31, with the knob 41 attached to the top of the thrust projection 39. FIG. 6 represents an equivalent circuit diagram of the variable delay line described above.

In the variable delay line so constructed, when the knob 41 is moved, the contact spring 43 is moved by a push given by the holder 35 and allowed to establish connection between a desired fixed contacts 27 selected from the row 29 of fixed contacts and the conductive plate 31. Of course, the increment resolution of the delay time obtainable with the variable delay line can be enhanced by adapting the contact spring 43 so that, during its moving along the row 29 of fixed contacts, it alternately repeats single contact with one fixed contact 27 and dual contact with two adjacent fixed contacts 27.

A signal added to the input terminal 69 from pulse generator PG through resistor $R_o/2$ is applied via the conductive plate 31 and the contact spring 43 into a selected fixed contact 27 and the signal, now accompanied by a delay time proportional to the number of sections occurring between the selected fixed contact 27 and the output terminal 75, is outputed through the output terminal 75 and the output common terminal 73.

In the construction of the variable delay line, a number of the turns between the adjacent fixed contacts 27 may be a plurality of turns of the conductor forming ghe inductance element 59. In this case, there can be obtained large variations of delay time each of one section consisting of a plurality of turns. Optionally, the fixed contacts 27 may be formed by partially projecting or extending the conductor strip 57 of the inductance element 59. Alternatively, the fixed contacts may be formed of printed boards connecting the inductance element to capacitors formed independently of the inductance element. The respective values of the terminating resistances $R_o$ and inductors L and capacitors C are, respectively, indicated symbolically by these letters in the drawing. These values are chosen in accordance with conventional techniques to yield the desired operating parameters for the delay line.

In the embodiment illustrated in FIG. 4, the inductance element 59 is formed by winding the conductor strip 57 in a single-layer solenoid around the planar bobbin 55. Otherwise, it may be formed by similarly winding a conductor wire instead. Alternatively, it may be formed by depositing a conductor layer around the bobbin and cutting the conductor layer in a spiral shape or a zigzag shape by any of the methods known to the art. The bobbin itself is not an indispensable component for the variable delay line.

The variable delay line cited above is only one example cited purely for the purpose of illustration. This invention can be utilized as switching means for a wide range of electronic devices including, of course, the variable delay line described above.

What is claimed is:

1. In a switch device comprising a nonconductive board member having arranged thereon a row of fixed electric contacts spaced at regular intervals one from the other, a conductive plate arranged in a plane parallel to that of said nonconductive board member and spaced a fixed distance from said row of fixed contacts, a moveable electric contact formed by bending a conductive plate substantially in the shape of an inverted letter W incorporating therein a first curve portion at the center thereof, which curved portion engages said fixed contacts and second curves positioned, respectively, on opposite sides and outwardly of said first curve and resiliently held in contact with said conductive plates, said second curves ending in outer tips of said moveable contact, a holder resiliently containing said moveable contact without attachment of said moveable contact thereto, said moveable contact being arranged therein such that a one of said tips of said moveable contact engages said holder when said holder is moved in a given direction along said row of fixed contact, the other tip engaging said holder when the holder is moved in the opposite direction, said holder being disposed between said conductive plate and said row of fixed contacts and having means for moving along said row of fixed contacts, the improvement comprising:

third curved surfaces formed outwardly of said second curves of said moveable contact member and ending in said outer tips said third curved surfaces engaging, respectively, walls of said holder as said holder is moved in a one direction or the other.

2. The improved switch device according to claim 1 wherein said third curved surfaces are formed as continuations of said second curves.

3. The improved switch device according to claim 2 wherein said moveable contact member's outer tips extend inwardly of said third curves and of said moveable contact member.

* * * * *